US009847468B1

(12) United States Patent
Lam et al.

(10) Patent No.: US 9,847,468 B1
(45) Date of Patent: Dec. 19, 2017

(54) PLATED LEAD FRAME INCLUDING DOPED SILVER LAYER

(71) Applicant: ASM Technology Singapore Pte Ltd, Singapore (SG)

(72) Inventors: Yu Lung Lam, Kwai Chung (HK); Yiu Fai Kwan, Tsuen Wai (HK); Ching Man Tsui, Kwai Chung (HK); Ho Ki Yeung, Yuen Long (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 0 days.

(21) Appl. No.: 15/187,314

(22) Filed: Jun. 20, 2016

(51) Int. Cl.
*H05K 1/03* (2006.01)
*H01L 33/62* (2010.01)
*H01L 21/48* (2006.01)
*H01L 23/495* (2006.01)
*H01L 21/288* (2006.01)

(52) U.S. Cl.
CPC .......... *H01L 33/62* (2013.01); *H01L 21/4821* (2013.01); *H01L 23/49582* (2013.01); *H01L 21/288* (2013.01)

(58) Field of Classification Search
CPC ......... H01L 21/02; H01L 21/60; H01L 23/00; H01L 23/48; H01L 23/52; H01L 33/48; H01L 33/60; B32B 15/01; B32B 15/04; C23C 28/00; C23C 28/02
USPC ......... 174/255, 524; 428/637, 645–647, 656, 428/671; 438/637; 257/88, 98, 99, 477, 257/666, 676, 690, 697, 762, 784; 205/50, 109, 194, 205, 238, 263, 518
See application file for complete search history.

(56) References Cited

U.S. PATENT DOCUMENTS

| 4,213,833 | A  | * | 7/1980  | Lefevre ..................... C25B 9/08 |
| | | | | 204/258 |
| 4,978,587 | A  | * | 12/1990 | Mori ........................ B32B 15/01 |
| | | | | 428/645 |
| 5,045,639 | A  | * | 9/1991  | Liu .................... H01L 23/49827 |
| | | | | 174/524 |
| 5,889,317 | A  | * | 3/1999  | Huang .............. H01L 23/49582 |
| | | | | 257/477 |
| 9,472,361 | B1 | * | 10/2016 | Mikan .................. H01H 13/785 |
| 2003/0082398 | A1 | * | 5/2003 | Tanaka .................... B32B 15/01 |
| | | | | 428/647 |
| 2004/0014312 | A1 | * | 1/2004 | Kunishima ......... H01L 21/2855 |
| | | | | 438/637 |
| 2004/0144641 | A1 | * | 7/2004 | De Nora ................... C25C 3/12 |
| | | | | 204/290.1 |
| 2006/0125073 | A1 | * | 6/2006 | Seki .................. H01L 23/49582 |
| | | | | 257/690 |
| 2006/0255357 | A1 | * | 11/2006 | Hata ....................... H01L 33/60 |
| | | | | 257/99 |
| 2009/0058591 | A1 | * | 3/2009 | Nakada .................... H01F 1/344 |
| | | | | 336/221 |
| 2010/0124619 | A1 | * | 5/2010 | Xu ........................ C23C 18/161 |
| | | | | 427/554 |
| 2010/0233506 | A1 | * | 9/2010 | Tokuhara ................ C25D 5/12 |
| | | | | 428/637 |

(Continued)

*Primary Examiner* — Xiaoliang Chen
(74) *Attorney, Agent, or Firm* — Ostrolenk Faber LLP

(57) ABSTRACT

A lead frame comprises a substrate comprising copper and includes a layer of bright silver is plated onto the substrate. A layer of doped bright silver is thereafter plated over a top surface of the layer of bright silver for enhancing the performance of LED devices utilizing the lead frame.

9 Claims, 1 Drawing Sheet

(56) References Cited

U.S. PATENT DOCUMENTS

| | | | | |
|---|---|---|---|---|
| 2011/0097597 A1* | 4/2011 | Yau | ............ | C23C 18/54 |
| | | | | 428/647 |
| 2012/0097545 A1* | 4/2012 | Imori | ............ | C23C 22/60 |
| | | | | 205/50 |
| 2012/0171432 A1* | 7/2012 | Lee | ............ | C23C 18/1605 |
| | | | | 428/195.1 |
| 2012/0217526 A1* | 8/2012 | Kumura | ............ | H01L 33/486 |
| | | | | 257/98 |
| 2012/0301745 A1* | 11/2012 | Kobayashi | ............ | C25D 5/12 |
| | | | | 428/656 |
| 2012/0313131 A1* | 12/2012 | Oda | ............ | H01L 23/49503 |
| | | | | 257/98 |
| 2015/0008455 A1* | 1/2015 | Tozawa | ............ | H01L 33/60 |
| | | | | 257/88 |
| 2015/0126081 A1* | 5/2015 | Oda | ............ | B23K 35/26 |
| | | | | 439/887 |
| 2016/0032479 A1* | 2/2016 | Li | ............ | C25D 3/46 |
| | | | | 205/109 |
| 2016/0233387 A1* | 8/2016 | Kitano | ............ | C09K 11/617 |

\* cited by examiner

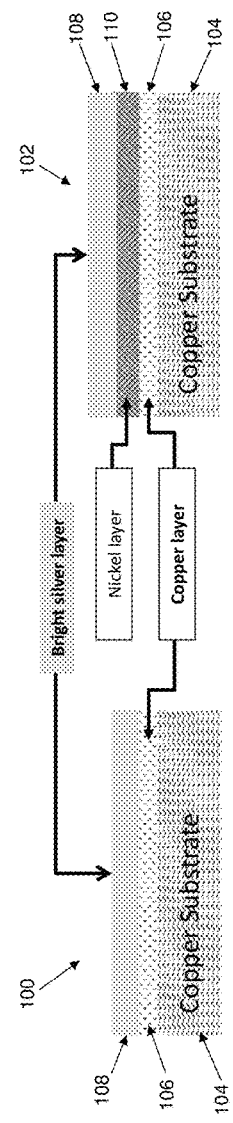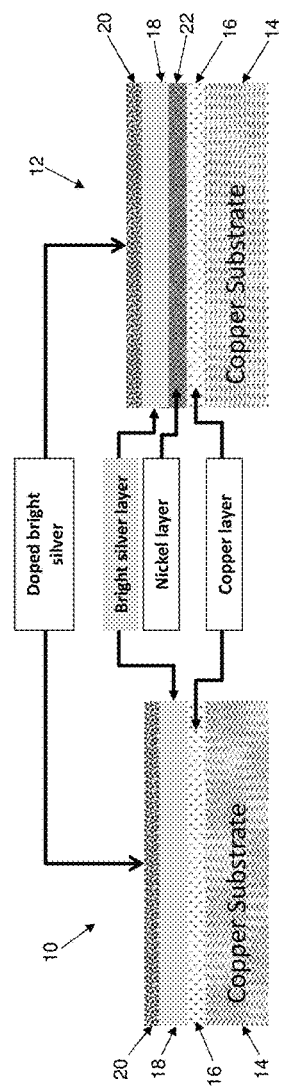

PLATED LEAD FRAME INCLUDING DOPED SILVER LAYER

FIELD OF THE INVENTION

The invention relates to lead frames for the assembly of semiconductor devices, and in particular to lead frames that are adapted for the assembly of light-emitting device ("LED") related products.

BACKGROUND AND PRIOR ART

In lead frames used for the assembly of LED-related products, a bright silver plating is typically plated on a copper lead frame, or a bright silver plating is plated on a nickel plating layer such that the nickel plating layer is located between the bright silver plating layer and the copper lead frame.

FIG. 1 illustrates prior art plating schemes for the manufacture of bright silver LED devices. A first typical prior art plating scheme for a lead frame 100 comprises a base copper substrate 104 which is plated with copper to form a copper layer 106 over the base copper substrate 104. The copper layer 106 is further plated with a bright silver layer 108 comprising silver.

A second typical prior art plating scheme for a lead frame 102 comprises a base copper substrate 104 which is plated with copper to form a copper layer 106 over the base copper substrate 104. Nickel is then plated over the copper layer 106 to form a nickel layer 110 on top of it. Finally, the lead frame 102 is plated with a bright silver layer 108 on top of the nickel layer 110.

For both plating schemes used to fabricate the respective lead frames 100, 102, copper plating is applied on the surface of the base copper substrate 104 prior to conducting bright silver plating or nickel plating onto the lead frame surface.

In the typical plating schemes described above, it has been found that silver or silver ion migration occurs on the bright silver layer 108. Such silver or silver ion migration is a major problem because it causes tarnishing of the bright silver layer 108, leading to a decrease in the lumen or emission of visible light from the LED device. The foregoing events deteriorate LED performance in the final product.

SUMMARY OF THE INVENTION

It is thus an object of the invention to seek to improve the LED performance in LED devices by retarding migration of silver or silver ions to the surface of the lead frame.

According to a first embodiment of the invention, there is provided a method of manufacturing a lead frame, comprising the steps of: providing a substrate comprising copper; plating a layer of bright silver onto the substrate; and thereafter plating a layer of doped bright silver over a top surface of the layer of bright silver.

According to a second embodiment of the invention, there is provided a lead frame comprising: a substrate comprising copper; a layer of bright silver; and a layer of doped bright silver over a top surface of the layer of bright silver.

It would be convenient hereinafter to describe the invention in greater detail by reference to the accompanying drawings which illustrate specific preferred embodiments of the invention. The particularity of the drawings and the related description is not to be understood as superseding the generality of the broad identification of the invention as defined by the claims.

BRIEF DESCRIPTION OF THE DRAWINGS

Examples of plating processes in accordance with the invention will now be described with reference to the accompanying drawings, in which:

FIG. 1 illustrates prior art plating schemes for the manufacture of bright silver LED devices; and FIG. 2 illustrates plating schemes for the manufacture of bright silver LED devices according to the preferred embodiment of the invention.

DETAILED DESCRIPTION OF THE PREFERRED EMBODIMENT OF THE INVENTION

FIG. 2 illustrates plating schemes for the manufacture of bright silver LED devices according to the preferred embodiment of the invention. One embodiment of a lead frame 10 fabricated according to the plating scheme comprises a base copper substrate 14 which is plated with copper to form a copper layer 16 over the base copper substrate 14. Thereafter, a bright silver layer 18 comprising silver is plated onto the copper layer 16. Thereafter, a doped bright silver layer 20 is further formed over a top surface of the underlying bright silver layer 18.

In another embodiment of a lead frame 12 manufactured according to the plating scheme, a base copper substrate 14 is plated with copper to form a copper layer 16 over the base copper substrate 14. A layer of nickel is then plated over the copper layer 16 to form a nickel layer 22 on top of it. Thereafter, the nickel layer 22 is plated with a bright silver layer 18 on top of the nickel layer 22. A doped bright silver layer 20 is then further formed over the underlying bright silver layer 18.

According to the preferred embodiment, the plating to form the copper layer 16 may be performed in an aqueous solution comprising: 10-80% Copper sulfate, 0.1-1% brightener, 0.1-1% leveler and 0.1-1% carrier. The carrier may be made from a polymeric material, such as Polyethylene Glycol (PEG) or Polyalkylene Glycol (PAG). The brightener may comprise organic sulfides, disulfides, thioether or thiocarbamates, and the leveler may comprise quaternary nitrogen compounds.

The plating to form the nickel layer 22 may be conducted in an aqueous solution comprising: 30-80% nickel sulfamate, 15-30% nickel chloride and 5-10% boric acid.

The plating of the bright silver layer 18 may be conducted in an aqueous solution comprising: 20-60% Potassium silver cyanide, 10-15% potassium cyanide, 0.5-5% brightener, and 20-30% potassium phosphate.

The dopant used to form the doped bright silver layer 20 may comprise either palladium or gold. In case palladium is used as the dopant, plating of the doped bright silver layer 20 is conducted in an aqueous solution comprising: 2-20% ammonium tetrachloropalladate, and 40-60% ammonium phosphate. Alternatively, where palladium is used as the dopant, plating may also be conducted in an aqueous solution comprising: 2-20% ammonium tetrachloropalladate, 40-60% ammonium phosphate, and 1-5% brightener.

Where gold is used as the dopant, plating is conducted in an aqueous solution comprising: 2-20% potassium gold cyanide and 20-40% potassium phosphate.

It should be appreciated that a dopant comprising palladium and/or gold integrated in bright silver layer can improve the performance of LED as the GAM (gamma brightness) of silver is increased and the doped silver retards silver or silver ion migration. The dopant thus promotes the GAM of silver as well as improves GAM stability by minimizing silver or silver ion migration.

With the addition of the dopant, the GAM of silver can be improved by 0.2 GAM, and stronger thermal stability of the lead frame 10, 12 is achieved since the GAM of silver can thereby be preserved even after heating the lead frame 10, 12 at 360° C. for 20 seconds.

The invention described herein is susceptible to variations, modifications and/or additions other than those specifically described and it is to be understood that the invention includes all such variations, modifications and/or additions which fall within the spirit and scope of the above description.

The invention claimed is:

1. Method of manufacturing a lead frame, comprising the steps of:
   providing a substrate comprising copper;
   plating a layer of bright silver onto the substrate;
   after plating the layer of bright silver onto the substrate, plating a layer of doped bright silver over a top surface of the layer of bright silver; and
   plating a layer of copper onto the substrate prior to plating the layer of bright silver, such that the layer of bright silver is plated over the layer of copper;
   wherein the step of plating the layer of copper is conducted in an aqueous solution comprising copper sulfate, a brightener, a leveler and a carrier.

2. Method of manufacturing a lead frame as claimed in claim 1, wherein the carrier comprises Polyethylene Glycol (PEG) or Polyalkylene Glycol.

3. Method of manufacturing a lead frame, comprising the steps of:
   providing a substrate comprising copper;
   plating a layer of bright silver onto the substrate;
   after plating the layer of bright silver onto the substrate, plating a layer of doped bright silver over a top surface of the layer of bright silver; and
   plating a layer of nickel prior to plating the layer of bright silver, such that the layer of bright silver is plated over the layer of nickel;
   wherein the step of plating the layer of nickel is conducted in an aqueous solution comprising nickel sulfamate, nickel chloride and boric acid.

4. Method of manufacturing a lead frame, comprising the steps of:
   providing a substrate comprising copper;
   plating a layer of bright silver onto the substrate; and thereafter
   plating a layer of doped bright silver over a top surface of the layer of bright silver;
   wherein the step of plating the layer of bright silver is conducted in an aqueous solution comprising potassium silver cyanide, potassium cyanide, a brightener, and potassium phosphate.

5. Method of manufacturing a lead frame as claimed in claim 4, wherein the dopant used for doping the layer of doped bright silver comprises palladium.

6. Method of manufacturing a lead frame as claimed in claim 5, wherein the step of plating the layer of doped bright silver is conducted in an aqueous solution comprising ammonium tetrachloropalladate and ammonium phosphate.

7. Method of manufacturing a lead frame as claimed in claim 5, wherein the step of plating the layer of doped bright silver is conducted in an aqueous solution comprising ammonium tetrachloropalladate, ammonium phosphate, and a brightener.

8. Method of manufacturing a lead frame as claimed in claim 4, wherein the dopant used for doping the layer of doped bright silver comprises gold.

9. Method of manufacturing a lead frame as claimed in claim 8, wherein the step of plating the layer of doped bright silver is conducted in an aqueous solution comprising potassium gold cyanide and potassium phosphate.

* * * * *